(12) United States Patent
Kuo et al.

(10) Patent No.: US 9,231,158 B2
(45) Date of Patent: Jan. 5, 2016

(54) LIGHT-EMITTING DIODE STRUCTURE WITH ELECTRODE PADS OF SIMILAR SURFACE ROUGHNESS AND METHOD FOR MANUFACTURING THE SAME

(75) Inventors: Cheng-Ta Kuo, Hsinchu (TW); Kuo-Hui Yu, Chia Yi Hsien (TW); Chao-Hsing Chen, Tainan County (TW); Tsun-Kai Ko, Changhua County (TW); Chi-Ming Huang, Tainan County (TW); Shih-Wei Yen, Tainan County (TW); Chien-Kai Chung, Tainan County (TW)

(73) Assignee: Epistar Corporation, Hsinchu (TW)

( * ) Notice: Subject to any disclaimer, the term of this patent is extended or adjusted under 35 U.S.C. 154(b) by 918 days.

(21) Appl. No.: 13/221,908

(22) Filed: Aug. 31, 2011

(65) Prior Publication Data

US 2011/0312113 A1    Dec. 22, 2011

Related U.S. Application Data

(62) Division of application No. 11/699,942, filed on Jan. 30, 2007.

(30) Foreign Application Priority Data

Dec. 29, 2006    (TW) .............................. 95150037 A

(51) Int. Cl.
   *H01L 21/00*    (2006.01)
   *H01L 33/38*    (2010.01)
   *H01L 33/20*    (2010.01)

(52) U.S. Cl.
   CPC ................ *H01L 33/38* (2013.01); *H01L 33/20* (2013.01); *H01L 33/382* (2013.01); *H01L 2933/0016* (2013.01)

(58) Field of Classification Search
   USPC ............... 257/79, 99, E33.006, E33.062, 257/E33.065; 438/39, 42
   See application file for complete search history.

(56) References Cited

U.S. PATENT DOCUMENTS

| | | | |
|---|---|---|---|
| 5,272,355 A * | 12/1993 | Namavar et al. | 257/3 |
| 5,650,641 A * | 7/1997 | Sassa et al. | 257/88 |
| 7,760,783 B2 * | 7/2010 | Hirukawa et al. | 372/45.01 |
| 2004/0089868 A1 * | 5/2004 | Hon et al. | 257/79 |

* cited by examiner

*Primary Examiner* — Robert Huber
(74) *Attorney, Agent, or Firm* — Ding Yu Tan

(57) ABSTRACT

A light-emitting diode (LED) structure and a method for manufacturing the LED structure are disclosed for promoting the recognition rate of LED chips, wherein a roughness degree of the surface under a first electrode pad of a first conductivity type is made similar to that of the surface under a second electrode pad of a second conductivity type, so that the luster shown from the first electrode pad can be similar to that from the second electrode pad, thus resolving the poor recognition problem of wire-bonding machines caused by different lusters from the first and second electrode pads.

9 Claims, 4 Drawing Sheets

LIGHT-EMITTING DIODE STRUCTURE WITH ELECTRODE PADS OF SIMILAR SURFACE ROUGHNESS AND METHOD FOR MANUFACTURING THE SAME

CROSS REFERENCE TO RELATED APPLICATIONS

This is a divisional of U.S. application Ser. No. 11/699,942 filed on Jan. 30, 2007, now pending, and this divisional application having the same inventors as the prior application. The present application is based on, and claims priority from, Taiwan Application Serial Number 95150037, filed Dec. 29, 2006, the disclosure of all of the above-mentioned applications are hereby incorporated by reference herein in their entirety.

FIELD OF THE INVENTION

The present invention relates to a light-emitting diode (LED) structure and a method for manufacturing the same, and more particularly, to a LED structure and its manufacturing method for promoting the LED chip recognition rate.

BACKGROUND OF THE INVENTION

Referring to FIG. 1, FIG. 1 is a schematic cross-sectional view showing a conventional LED structure, wherein on a substrate 100, a buffer layer 110 and a n-type confining layer 120 are formed in sequence. An active layer 130, a p-type confining layer 140, a transparent electrode layer 150 and a p-type electrode pad 160 are formed on one portion of the n-type confining layer 120, and a n-type electrode pad 170 is formed on the other portion of the n-type confining layer 120. The n-type electrode pad 170 is spaced from a light-emitting epitaxial structure 180 by a predetermined gap d, wherein the light-emitting epitaxial structure 180 is composed of the active layer 130, the p-type confining layer 140 and the transparent electrode layer 150.

After a LED structure is formed, it is desirable to perform the subsequent processes of die bonding and wire bonding. The die bonding or wire bonding process mainly uses an image comparison and recognition method to select a LED chip matching a predetermined reference image. At this point, in the conventional LED structure, due to the etching process, the surface roughness of the epitaxial layers (the p-type confining layer 140 and the transparent electrode layer 150) under the p-type electrode pad 160 is different from that of the epitaxial layers (the n-type confining layer 120) under the n-type electrode pad 170, and thus the light scattering and reflected intensities of the p-type electrode pad 160 are inconsistent with those of the n-type electrode pad 170, thus lowering the image recognition rate, leading to the increase of downtime ratio, further causing the occurrence of abnormalities or the decrease of production, and resulting in rough surface textures.

The conventional skill adopts the method of adjusting etch parameters to make the surface roughnesses of the epitaxial layers under these two electrode pads as similar as possible. However, the respective conditions are different for each product lot, so that the conventional method of adjusting the etch parameters is significantly limited and it is difficult to make the surface roughnesses of the epitaxial layers under these two electrode pads reach the same level, thus causing recognition difficulty in the processes of die bonding and wire bonding. Moreover, this conventional skill has to adjust the etch parameter for each individual product lot, and thus is not suitable for use in mass production.

SUMMARY OF THE INVENTION

An aspect of the present invention is to provide a LED structure and a method for manufacturing the same, thereby making the epitaxial layers under two electrode pads have similar surface roughnesses for forming two electrode pads of similar lusters, thus promoting the image recognition rate and accuracy in the processes of die bonding and wire bonding, further increasing the overall production, decreasing the amount of inferior products, and improving the problem of rough surface textures.

According to an embodiment of the present invention, the LED structure includes a substrate, a first confining layer having a first electrical property, a light-emitting epitaxial structure disposed on a first portion of the first confining layer, a protrusive structure disposed on a second portion of the first confining layer, a n-type electrode pad covering the protrusive structure, and a p-type electrode pad disposed on a second confining layer having a second electrical property. The first confining layer is disposed on the substrate. The light-emitting epitaxial structure includes an active layer disposed on the first portion of the confining layer, and the second confining layer disposed on the active layer, wherein the first electrical property is opposite to the second electrical property. The protrusive structure is spaced from the light-emitting epitaxial structure by a predetermined gap exposing the first confining layer. The material layers forming the protrusive structure are substantially equivalent to the material layers forming the light-emitting epitaxial structure with respect to the material species and arrangement sequence, and the thickness of the material layers forming the protrusive structure is smaller than or equal to the thickness of the material layers forming the light-emitting epitaxial structure. The n-type electrode pad is electrically connected to the first confining layer.

According to an embodiment of the present invention, in a method for manufacturing a light-emitting diode structure, a substrate is provided. Then, a first confining layer having a first electrical property is formed on the substrate. Thereafter, an active layer is formed on the confining layer, and a second confining layer having a second electrical property is formed on the active layer, wherein the first electrical property is opposite to the second electrical property. Then, a photoresist layer is coated on a surface of the second confining layer, wherein the photoresist layer has a predetermined gap. Thereafter, a step is performed for etching the second confining layer and the active layer along the predetermined gap by using the photoresist layer as a mask, and then the photoresist layer is removed so as to form a light-emitting epitaxial structure and a protrusive structure. Then, a n-type electrode pad is fabricated to cover the protrusive structure, wherein the n-type electrode pad is electrically connected to the first confining layer. Thereafter, a p-type electrode pad is formed on a top surface of the light-emitting epitaxial structure.

According to another embodiment of the present invention, the LED structure further comprises a buffer layer disposed between the substrate and the first confining layer.

According to another embodiment of the present invention, the LED structure further comprises a low-temperature buffer layer disposed on the substrate, and a high-temperature buffer layer disposed on the low-temperature buffer layer.

According to another embodiment of the present invention, the LED structure further comprises transparent electrode layers disposed on a top surface of the light-emitting epitaxial structure and on a top surface of the protrusive structure.

According to another embodiment of the present invention, the first electrical property is n type, and the second electrical property is p type.

BRIEF DESCRIPTION OF THE DRAWINGS

The foregoing aspects and many of the attendant advantages of this invention are more readily appreciated as the same become better understood by reference to the following detailed description, when taken in conjunction with the accompanying drawings, wherein.

DETAILED DESCRIPTION OF THE PREFERRED EMBODIMENT

An embodiment of the present invention shown hereinafter is used to resolve the problem of poor image recognition and rough surface textures caused by different levels of surface roughness of the epitaxial layers under two respective electrode pads. The embodiment of the present invention reserves a complete epitaxial structure (protrusive structure) in the area under a n-type electrode pad, and the protrusive structure is substantially equivalent to a light-emitting epitaxial structure under a p-type electrode pad, wherein the thickness of the material layers forming the protrusive structure is smaller than or equal to the thickness of the material layers forming the light-emitting epitaxial structure, thereby making the surface roughnesses of the epitaxial layers under these two electrode pads as similar as possible, thus resolving the problem of rough surface textures. Moreover, a portion of the n-type electrode pad directly contacts a n-type epitaxial layer so as to assure that no change would occur in the electrical properties of the LED. In order to make the illustration of the present invention more explicit, the following description is provided with reference to FIG. 2A to FIG. 2F. FIG. 2A to FIG. 2E are schematic cross-sectional diagrams showing the process for manufacturing a light-emitting diode structure in accordance with an embodiment of the present invention, wherein FIG. 2E is schematic cross-sectional view showing the LED structure in accordance with the embodiment of the present invention.

Figure 1:
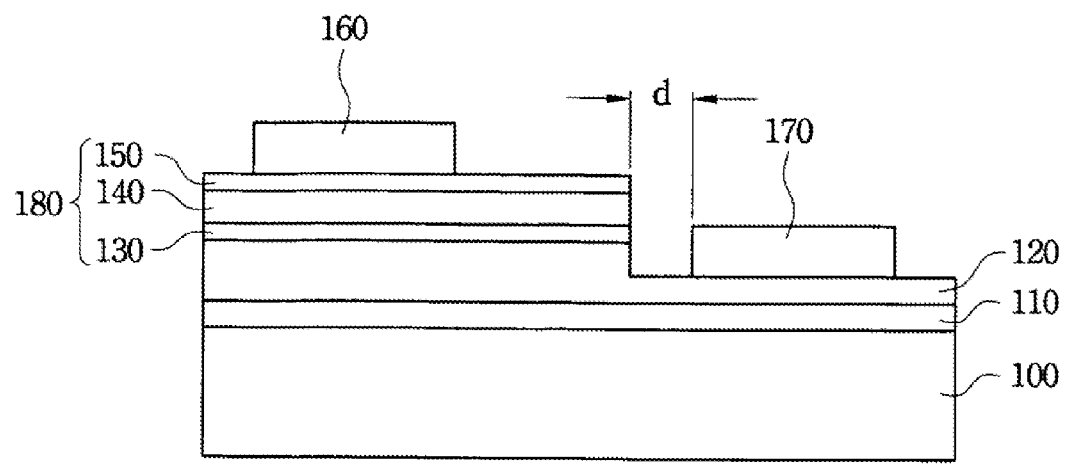
FIG. 1 is a schematic cross-sectional view showing a conventional LED structure.
Figure 2A:
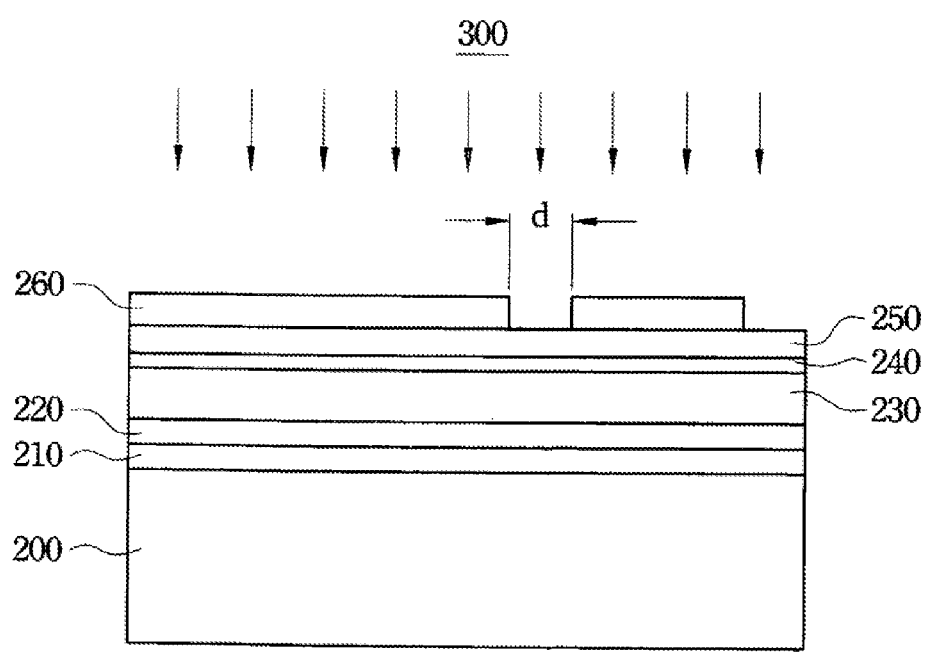
FIG. 2A to FIG. 2E are schematic cross-sectional diagrams showing the process for manufacturing a light-emitting diode structure in accordance with an embodiment of the present invention.
Figure 2B:
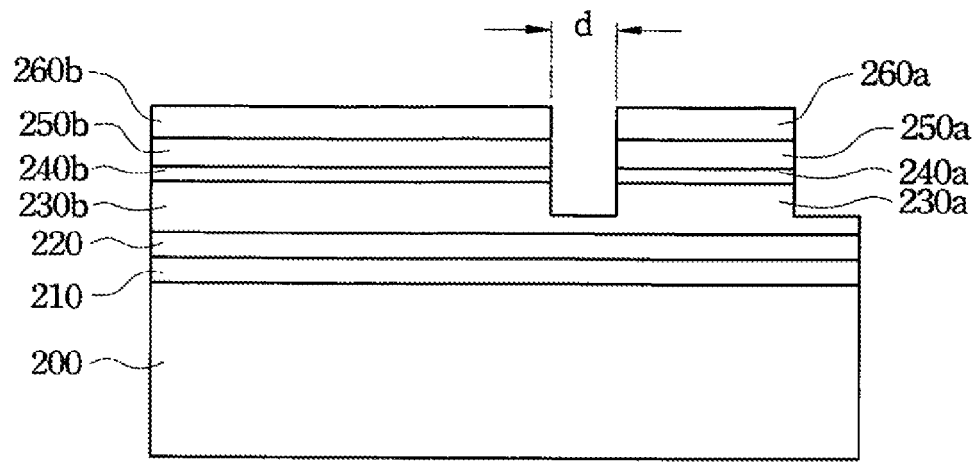
Figure 2C:
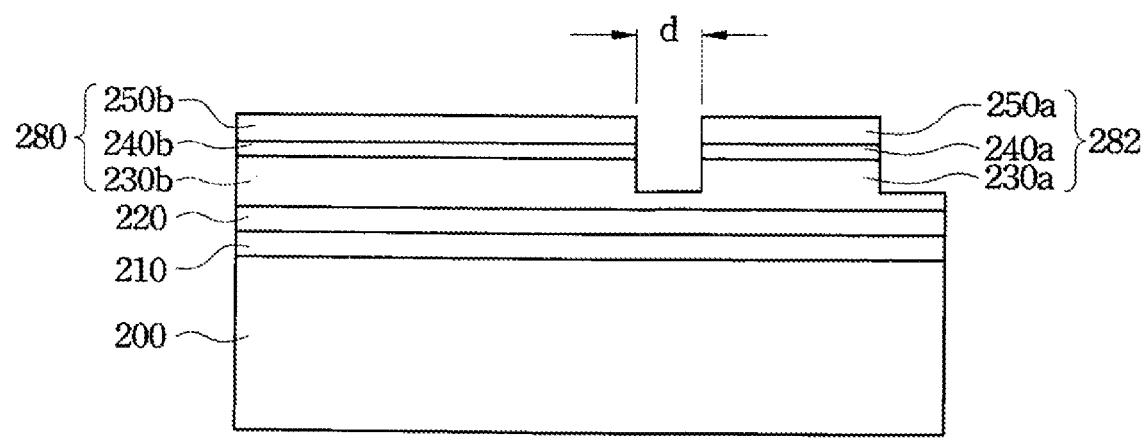

As shown in FIG. 2A, a substrate 200 is first provided, wherein the material forming the substrate 200 can be such as sapphire, ZnO, LiGaO.sub.2, spinel, SiC, GaN or silicon. Thereafter, a low-temperature buffer layer 210 is formed on the substrate 200, and a high-temperature buffer layer 220 is formed on the low-temperature buffer layer 210. However, the present embodiment may merely need to form the low-temperature buffer layer 210 or the high-temperature buffer layer 220 on the substrate 200. Then, a first confining layer 230 having a first electrical property is formed on the high-temperature buffer layer 220, wherein the first confining layer 230 is made of such as GaN, and the first electrical property is such as n-type. Thereafter, an active layer 240 is formed on the first confining layer 230, wherein the active layer 240 can be for example a single layer structure of In.sub.xGa.sub.1-xN, or a multiple quantum well (MQW) structure with n periods (n.1). Then, a second confining layer 250 having a second electrical property is formed on the active layer 240, wherein the second confining layer 250 is made of such as GaN, and the second electrical property is opposite to the first electrical property, for example p-type. Thereafter, a photoresist layer 260 is coated on the surface of the second confining layer 250, wherein the photoresist layer 260 has a predetermined gap d. Thereafter, the photoresist layer 260 is used as a mask to etch the second confining layer 250 and the active layer 240 along the predetermined gap d until the first confining layer 230 is exposed. Such as shown in FIG. 2B, after etching, the photoresist layer is divided into a photoresist layer 260a and a photoresist layer 260b; the second confining layer is divided into a second confining layer 250a and a second confining layer 250b; the active layer is divided into an active layer 240a and an active layer 240b; and the first confining layer is divided into a first confining layer 230a and a first confining layer 230b. After the photoresist layers 260a and 260b are removed, a light-emitting epitaxial structure 280 and a protrusive structure 282 are formed, such as shown in FIG. 2C. The light-emitting epitaxial structure 280 is spaced from the protrusive structure 282 by the predetermined gap d.

Figure 2D:
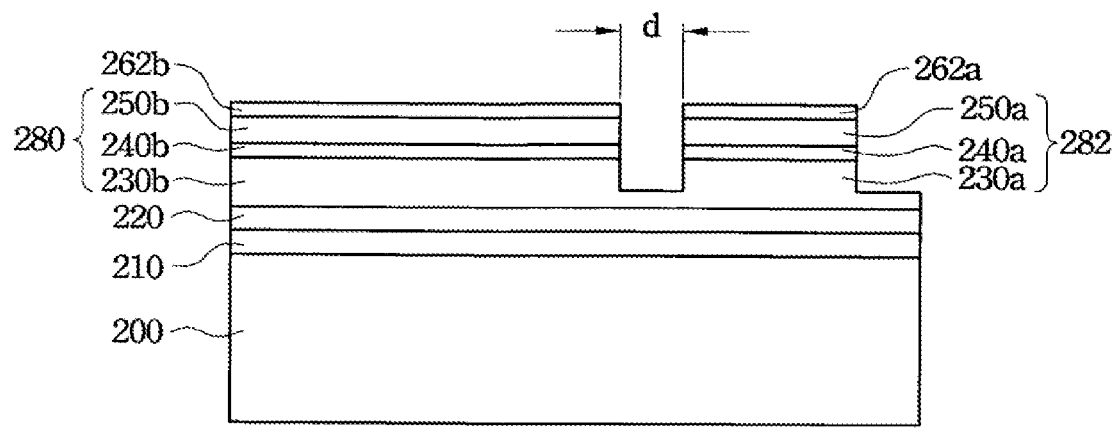
Figure 2E:
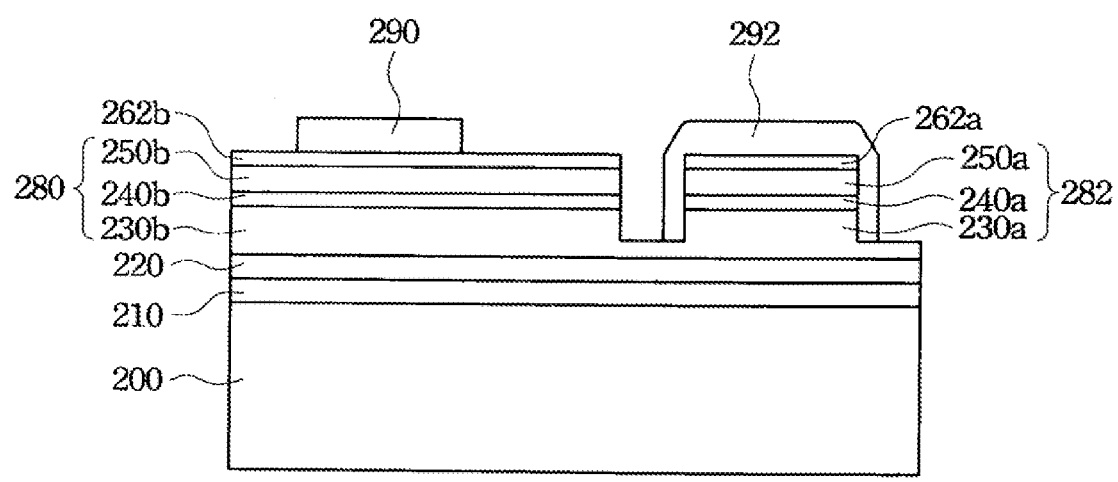

Thereafter, such as shown in FIG. 2D, a transparent electrode layer 262a and/or a transparent electrode layer 262b can be optionally formed on the top surface of the protrusive structure 282 and the top surface of the light-emitting epitaxial structure 280 (i.e. on the second confining layers 250a and 250b). Then, such as shown in FIG. 2E, a n-type electrode pad 292 is fabricated to cover the transparent electrode layer 262a and the protrusive structure 282, wherein the n-type electrode pad 292 is electrically connected to the first confining layers 230a and 230b. Meanwhile, a p-type electrode pad 290 is fabricated on the transparent electrode layer 262b.

It can be known from FIG. 2E that the epitaxial layers under the n-type electrode pad 292 form the protrusive structure 282, and the epitaxial layers under the p-type electrode pad 290 form the light-emitting epitaxial structure 280, wherein the material layers forming the protrusive structure 282 are substantially equivalent to the material layers forming the light-emitting epitaxial structure 280 with respect to the material species and arrangement sequence, and additionally, the present embodiment does not perform an etch step on the top surface of the protrusive structure 282 or on top surface of the light-emitting epitaxial structure 280. Therefore, it can be assured that the top surface roughness of the protrusive structure 282 is very close to that of the light-emitting epitaxial structure 280, and thus the n-type electrode pad 292 and the p-type electrode pad 290 with similar lusters can be made. Hence, the present embodiment has the advantages of promoting the image recognition rate and accuracy in the processes of die bonding and wire bonding; increasing the overall production; decreasing inferior products; and improving the problem of rough surface textures.

Figure 2F:
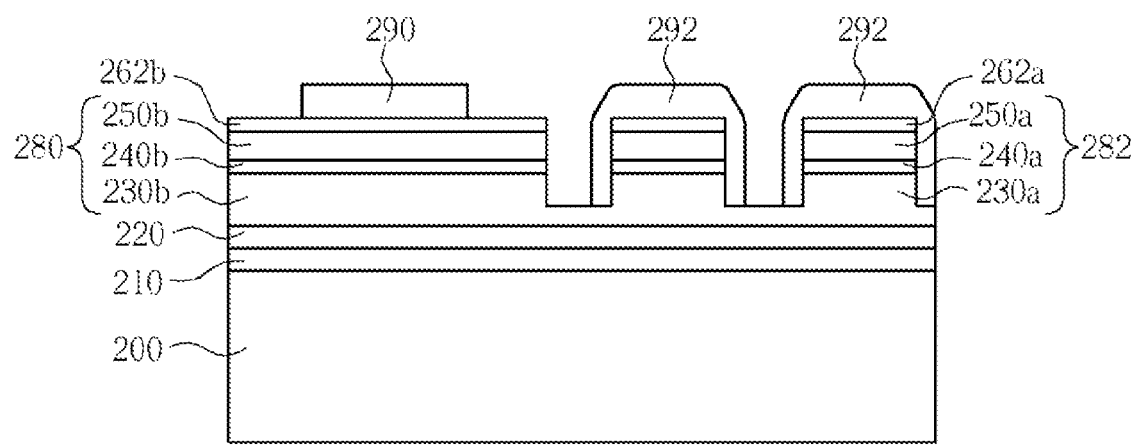
FIG. 2F is a schematic cross-sectional diagram showing a light-emitting diode structure in accordance with another embodiment of the present invention.

Referring to FIG. 2F, the protrusive structure also can be composed of a plurality of protrusive structure units 282 in the light-emitting diode structure in accordance with another embodiment of the present invention.

The aforementioned material species and types applied to the respective material layers are merely used as examples for explanation, and the present invention is not limited thereto.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for manufacturing a light-emitting diode structure, comprising:
   providing a substrate;
   forming a first confining layer on the substrate;
   forming an active layer on the first confining layer;
   forming a second confining layer on the active layer;
   coating a photoresist layer on a surface of the second confining layer, wherein the photoresist layer has a predetermined gap;
   etching the second confining layer and the active layer along the predetermined gap by using the photoresist layer as a mask;
   removing the photoresist layer, thereby forming a light-emitting epitaxial structure and a protrusive structure, wherein the material layers forming the protrusive structure are substantially equivalent to the material layers forming the light-emitting epitaxial structure with respect to material species and arrangement sequence, and the side surfaces of the protrusive structure are without undercut;
   fabricating a first electrode pad encapsulating the protrusive structure and directly contacting the exposed top and side surfaces of the protrusive structure; and
   fabricating a second electrode pad on a top surface of the light-emitting epitaxial structure, wherein the top surface roughness of the protrusive structure is very close to that of the light-emitting epitaxial structure.

2. The method according to claim 1, further comprising: forming a buffer layer between the substrate and the first confining layer.

3. The method according to claim 1, further comprising: respectively forming a low-temperature buffer layer and a high-temperature buffer layer between the substrate and the first confining layer, wherein the low-temperature buffer layer is disposed on the substrate, and the high-temperature buffer layer is disposed on the low-temperature buffer layer.

4. The method according to claim 1, wherein the material forming the substrate is selected from the group consisting of sapphire, ZnO, LiGaO2, spinel, SiC, GaN and silicon.

5. The method according to claim 1, wherein the first confining layer is n type, and the second confining layer is p type.

6. The method according to claim 1, wherein the protrusive structure is composed of a plurality of protrusive structure units.

7. The method according to claim 1, further comprising: forming a transparent electrode layer on a top surface of the light-emitting epitaxial structure; and forming the second electrode pad on the transparent electrode layer.

8. The method according to claim 1, further comprising: forming a transparent electrode layer on a top surface of the protrusive structure; and forming the first electrode pad covering the protrusive structure and the transparent electrode layer.

9. The method according to claim 1, wherein the active layer formed on the first confining layer is a structure other than a resonant optical cavity structure as in a laser diode.

* * * * *